(12) United States Patent
Arai

(10) Patent No.: US 7,724,039 B2
(45) Date of Patent: May 25, 2010

(54) CONVERSION CIRCUIT FOR CONVERTING DIFFERENTIAL SIGNAL INTO SIGNAL-PHASE SIGNAL

(75) Inventor: Tomoyuki Arai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/902,301

(22) Filed: Sep. 20, 2007

(65) Prior Publication Data
US 2008/0074179 A1 Mar. 27, 2008

(30) Foreign Application Priority Data
Sep. 26, 2006 (JP) .............................. 2006-261183

(51) Int. Cl.
*H03K 5/22* (2006.01)
(52) U.S. Cl. ....................... 327/70; 330/277; 326/63; 326/68; 326/80; 326/81; 327/68; 327/69; 327/534; 327/535; 327/536
(58) Field of Classification Search ............. 327/68–70, 327/148, 157, 333, 534–537; 326/63, 68, 326/80, 81; 330/252, 253, 292
See application file for complete search history.

(56) References Cited

U.S. PATENT DOCUMENTS

| | | | |
|---|---|---|---|
| 3,872,323 A | | 3/1975 | Frederiksen et al. |
| 4,835,489 A | * | 5/1989 | Monticelli ................ 330/277 |
| 5,406,219 A | | 4/1995 | Lou |
| 5,854,573 A | * | 12/1998 | Chan ........................ 330/292 |
| 6,400,616 B1 | * | 6/2002 | Tamura et al. ............. 365/198 |
| 7,002,409 B1 | * | 2/2006 | Aram ......................... 330/98 |
| 7,053,671 B1 | | 5/2006 | Wong |
| 7,233,165 B2 | * | 6/2007 | Jordy ......................... 326/29 |
| 2003/0013419 A1 | | 1/2003 | Razavi et al. |
| 2004/0169550 A1 | | 9/2004 | Perrier et al. |
| 2005/0249310 A1 | | 11/2005 | Pousset et al. |
| 2006/0001448 A1 | * | 1/2006 | Seo et al. .................. 326/80 |
| 2006/0214731 A1 | * | 9/2006 | Kelly et al. ................ 330/292 |

FOREIGN PATENT DOCUMENTS

| | | |
|---|---|---|
| EP | 1 575 161 A1 | 9/2005 |
| JP | 59231907 | 12/1984 |
| JP | 08-288762 | 11/1996 |
| JP | 2005-184628 | 7/2005 |
| WO | WO 00-42703 | 7/2000 |

OTHER PUBLICATIONS

Korean Patent Office Action based on Koren Patent Application No. 10-2007-0096531 (dated Jan. 20, 2009) (English translation attached).
Chinese Patent Office Action for Chinese Patent Application No. 200710161741.8 (Dated Jul. 24, 2009).

* cited by examiner

*Primary Examiner*—Lincoln Donovan
*Assistant Examiner*—John W Poos
(74) *Attorney, Agent, or Firm*—Hanify & King, PC

(57) ABSTRACT

A conversion circuit for converting a differential signal into a single-phase signal 1 has a source-follower amplifier 10 and a source-grounded amplifier 20. The source-follower amplifier 10 outputs a non-inverted signal IN of the differential signal the phase of which is not inverted. The source-grounded amplifier 20 inverts an inverted signal INX of the differential signal and adjusts its phase to that of the non-inverted signal IN. At point A, differential signals IN, INX are added and output as a single-phase signal OUT.

9 Claims, 8 Drawing Sheets

US 7,724,039 B2

CONVERSION CIRCUIT FOR CONVERTING DIFFERENTIAL SIGNAL INTO SIGNAL-PHASE SIGNAL

CROSS-REFERENCE TO RELATED APPLICATIONS

This application is based upon and claims the benefit of priority from the prior Japanese Patent Application No. 2006-261183, filed on Sep. 26, 2006, the entire contents of which are incorporated herein by reference.

BACKGROUND OF THE INVENTION

1. Field of the Invention

The present invention relates to a conversion circuit for converting differential signal into single-phase signal. More specifically, the present invention relates to a conversion circuit for converting differential signal into single-phase signal, which has a reduced chip area and improved power efficiency.

2. Description of the Related Art

In the prior art, there is a conversion circuit which convert differential signal with different phase into single-phase signal. For example, the conversion circuit is used in portable telephones, wireless LANs, and other applications in which, after conversion, the single-phase signal is output to a single antenna to perform communication.

As the conversion circuits of the prior art, for example a circuit which uses transformer 101 (or Balun), which is passive element (see FIG. 8A), and a circuit which uses transistors 104, 105 (see FIG. 8B), are widely used. In either case, differential signals are input from two input terminals IN and INX, and single-phase signal is output from an output terminal OUT.

Further, a conversion circuit for converting differential signal into single-ended signal, have also been disclosed which combine a plurality of current mirror circuits configured from transistors, so as to obtain single-ended signals without distortion (see for example the Japanese Patent Laid-open No. 8-288762).

However, in the case of the conversion circuit employing a transformer shown in FIG. 8A, the chip area is increased by the amount of the transformer 101. And in the case of the conversion circuit employing transistors shown in FIG. 8B, the single-phase signal OUT is obtained using only the output side of the inverted signals INX of the input differential signals, so that power loss is considerable.

Further, because in the above Patent Reference 1 a plurality of current mirror circuits are combined, the number of components is large, and the chip area similarly is increased.

SUMMARY OF THE INVENTION

Hence the present invention has been designed in consideration of the problem described above, and it is an object of the present invention to provide a conversion circuit for converting differential signal into single-phase signal, which reduces chip are and improves power efficiency.

In order to achieve the above object, one embodiment of the present invention is a conversion circuit for converting a differential signal into a single-phase signal having: an in-phase output amplifier which amplifies a first differential signal of a pair of differential signals with opposite phases, and outputs the first differential signal in-phase; and an inverted-output amplifier, capacitively coupled with the in-phase output amplifier, which amplifies the second differential signal of the differential signals, inverts the phase of the second differential signal, and adds the first differential signal to the second differential signal the phase of which is inverted to output a single-phase signal.

Further, in the conversion circuit, the in-phase output amplifier comprises a source-follower amplifier with the drain grounded, and the inverted-output amplifier comprises a source-grounded amplifier with the source grounded.

Further, in the conversion circuit, the in-phase output amplifier comprises a gate-grounded amplifier with the gate grounded, and the inverted-output amplifier comprises a source-grounded amplifier with the source grounded.

Further, the conversion circuit further has a phase adjuster, connected to the drain side or the source side of the source-grounded amplifier, or the output side of the source-follower amplifier, which adjusts the phase difference of the first differential signal or the second differential signal, or a gain adjuster, connected to the drain side or the source side of the source-grounded amplifier, which adjusts the gain of the first differential signal or the second differential signal.

Further, the conversion circuit further has a gain amplifier which adjusts the gain by amplifying the gain of the first or the second differential signal on the output side of the source-follower amplifier.

Further, the conversion circuit further has a detection circuit, connected to the output side of the source-grounded amplifier, which detects the phase difference or gain difference of the first or the second differential signal, and an arithmetic circuit which performs arithmetic operations on a adjustment amount based on a detection result of the detection circuit, wherein the phase adjuster or the gain adjuster performs phase adjustment or gain adjustment based on the adjustment amount.

Furthermore, in order to achieve the above object, another embodiment of the present invention is a conversion circuit for converting a differential signal into a single-phase signal having: an inverted-output amplifier which amplifies a first differential signal of a pair of differential signals with opposite phases and outputs the inverted signal obtained by inverting the phase of the first differential signal, and an in-phase output amplifier, capacitively coupled with the inverted-output amplifier, which amplifies the second differential signal of the pair of differential signals, obtains an in-phase differential signal of the same phase as the second differential signal, and adds the inverted signal to the in-phase differential signal to output a single-phase signal.

Furthermore, in order to achieve the above object, another embodiment of the present invention is a communication apparatus having: an in-phase output amplifier which amplifies a first differential signal of a pair of differential signals with opposite phases and outputs the first differential signal with the same phase; an inverted-output amplifier, capacitively coupled with the in-phase output amplifier, which amplifies the second differential signal of the differential signals, inverts the phase of the second differential signal, adds the first differential signal to the second differential signal with phase inverted, and outputs a single-phase signal; and a communication unit which performs communication based on the single-phase signal.

By means of the present invention, a conversion circuit for converting differential signal into single-phase signal can be provided with reduced chip area and improved power efficiency.

DESCRIPTION ON THE PREFERRED EMBODIMENTS

Figure 1:
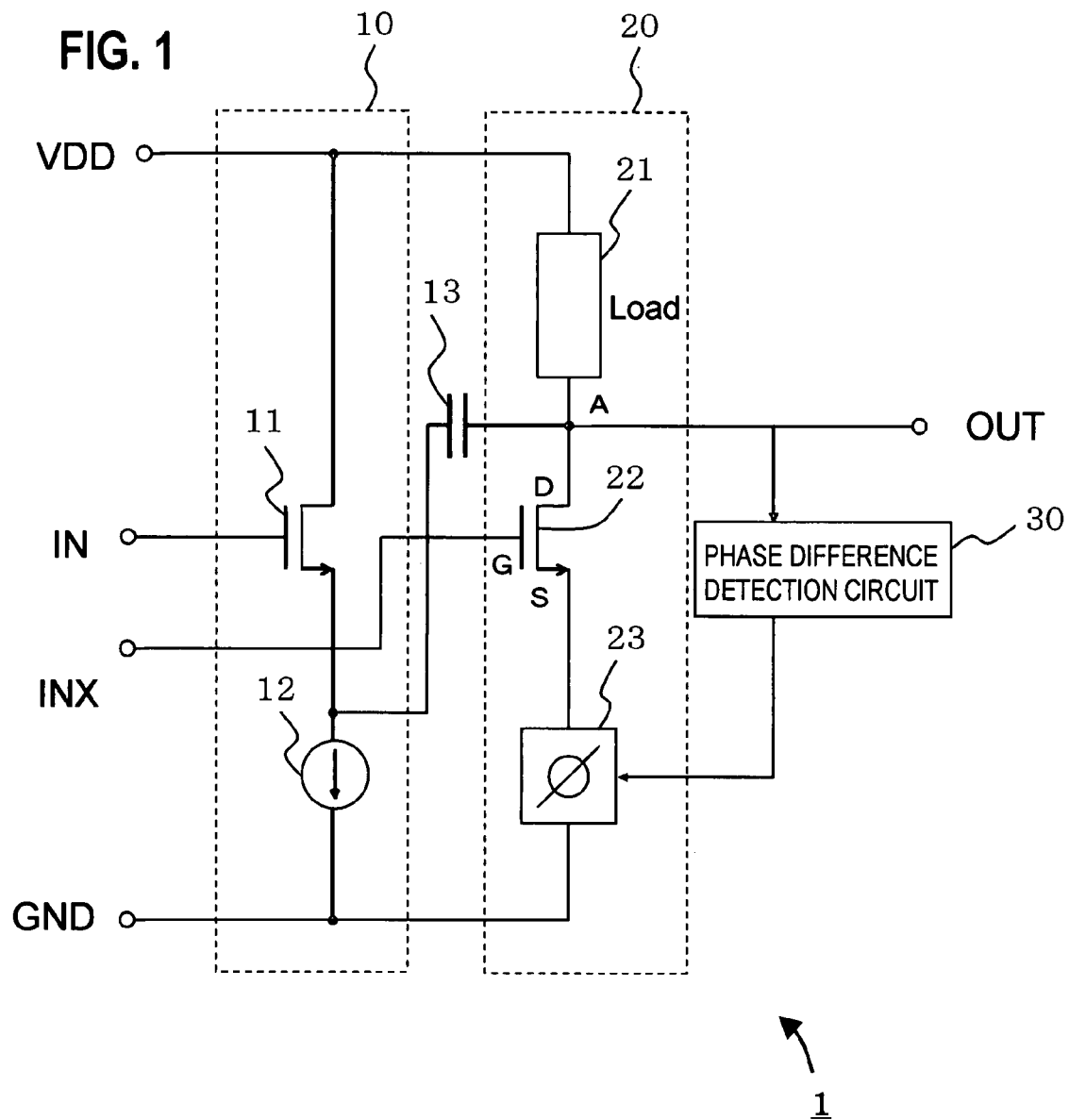
FIG. 1 shows an example of the configuration of a conversion circuit for converting a differential signal into a single-phase signal.

Below, detailed description of the preferred embodiment are explained, referring to the drawings.

FIG. 1 is a figure showing an example of the configuration of a conversion circuit for converting differential signal to single-phase signal 1 to which this present invention is applied. The conversion circuit 1 has a source-follower amplifier (in-phase output amplifier) 10 which amplifies the phase of one signal among a pair of differential signals with opposite phase, and outputs the signal in-phase; a source-grounded amplifier (inverted-output amplifier) 20 which amplifies the phase of the other signal of the pair of differential signals with opposite phase, and inverts and outputs the phase of the signal; a capacitor 13 connected in series with the source-follower amplifier 10 and source-grounded amplifier 20; and a phase difference detection circuit 30.

The source-follower amplifier 10 has a first transistor 11 and a constant-current source 12.

The non-inverted signal IN of the differential signals is input to the gate of the first transistor 11. A power supply VDD is connected to the source of the first transistor 11, and a constant-current source 12 is connected to the drain. Further, the capacitor 13 is connected to the drain. One terminal of the constant-current source 12 is connected to ground (GND).

The source-grounded amplifier 20 has a load circuit 21 which amplifies the output single-phase signal OUT, a second transistor 22, and a phase adjuster 23 which adjusts the phase of the differential signal based on the detection result of the phase difference detection circuit 30.

The load circuit 21 has a resistor or inductor, and is connected to the power supply VDD. The second transistor 22 is connected to the load circuit 21 as well as to the phase adjuster 23. The phase adjuster 23 is also connected to ground (GND).

At point A between the load circuit 21 and second transistor 22, the output side of the capacitor 13 is connected, and the single-phase signal OUT is output from point A.

The phase difference detection circuit 30 input the single-phase signal OUT from the source-grounded amplifier 20, detects the phase difference between the differential signals IN, INX from the single-phase signal OUT, and outputs the detection result to the phase adjuster 23. Based on the detection result, the phase adjuster 23 adjusts the phase of the inverted signal INX of the differential signals (or, the phase of the non-inverted signal IN of the differential signals) input to the gate of the second transistor 22. As shown in FIG. 1, a feedback loop is formed by the phase difference detection circuit 30, phase adjuster 23 and similar.

Operation in the conversion circuit 1 configured as described above is as follows. The non-inverted signal IN of the differential signals is input to the gate of the first transistor 11, and is output from the drain by the constant-current source 12. The non-inverted signal IN is output via capacitor 13 to point A.

On the other hand, the inverted signal INX of the differential signals is input to the gate of the second transistor 22. The load circuit 21 is connected to the power supply VDD, and is configured by a resistance or similar of constant value, so that the higher the input voltage of the inverted signal INX input to the gate, the larger is the current flowing in the load circuit 21, and so the lower is the voltage at the drain of the second transistor 22. That is, as the input voltage of the inverted signal INX is high, the voltage at the drain of the second transistor 22 is low.

Further, as the input voltage of the inverted signal INX input to the gate of the second transistor 22 is low, the current flowing in the load circuit 21 is large, and the drain voltage is high.

That is, the higher the voltage of the inverted signal INX of the differential signals, the lower is the drain voltage of the second transistor 22, and the lower the voltage of the inverted signal INX, the higher is the drain voltage, so that a signal of the same phase as the non-inverted signal IN, resulting from phase inversion of the inverted signal INX, is output from the drain of the second transistor 22.

Hence at point A, single-phase signal OUT is obtained, resulting from addition of the non-inverted signal IN of the differential signals and the inverted signal INX of the differential signals with the same phase as this non-inverted signal IN (in phase with the non-inverted signal IN).

In this way, both the input differential signals IN and INX are used in conversion to single-phase signal OUT, so that the conversion circuit 1 is obtained in which power losses are suppressed. Further, a transformer, plurality of current mirror circuits, and similar are not used, so that the conversion circuit 1 is obtained with reduced chip area.

Next, a specific configuration example of the conversion circuit 1 is explained, using FIG. 2 through FIG. 6.

Figure 2:
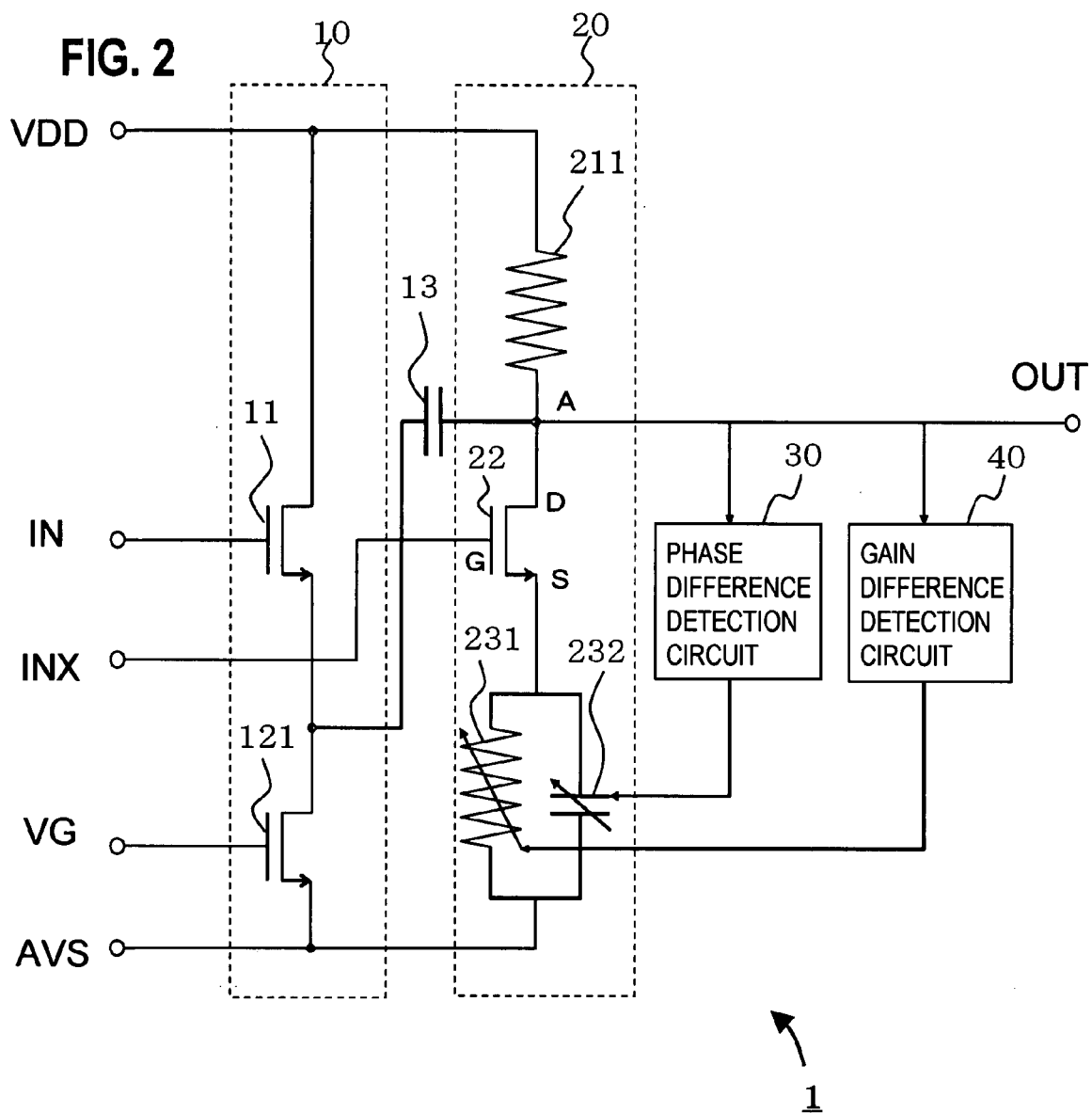
FIG. 2 shows an example of the specific configuration of a conversion circuit for converting a differential signal into a single-phase signal.

The conversion circuit 1 of FIG. 2 uses a third transistor 121 as the constant-current source 12, a resistor 211 having a constant resistance value as the load circuit 21, and a variable resistance 231 as the phase adjuster 23. In addition, the conversion circuit 1 has a gain difference detection circuit 40 and a variable capacitor 232 as a gain adjuster. Otherwise the configuration is similar to that of FIG. 1.

The variable capacitor 232 can change the capacitance based on the detection result detected by the phase difference detection circuit 30, and adjusts the phase difference of the two differential signals IN, INX.

The gain difference detection circuit 40 detects the gain difference of the two differential signals IN, INX based on the single-phase signal OUT, and outputs the detection result to the variable resistance 231. The variable resistance 231 can change resistance value based on the detection result, and by these units can make adjustments such that the gain of the inverted signal INX and the gain of the non-inverted signal IN of the differential signals are substantially the same. The resistance value of the variable resistance 231 is controlled by switching of a switch.

Similarly to the example of FIG. 1, at point A the inverted signal INX with the same phase as the non-inverted signal IN of the differential signals is output from the second transistor 22, and the non-inverted signal IN output from the capacitance 13 is added to the inverted signal INX. Hence the conversion circuit 1 shown in FIG. 2 also can have a reduced chip size and suppressed power losses.

In the example shown in FIG. 2, by the variable resistance 231, differential signals IN, INX can be obtained with the gains adjusted so as to be substantially equal.

Figure 3:
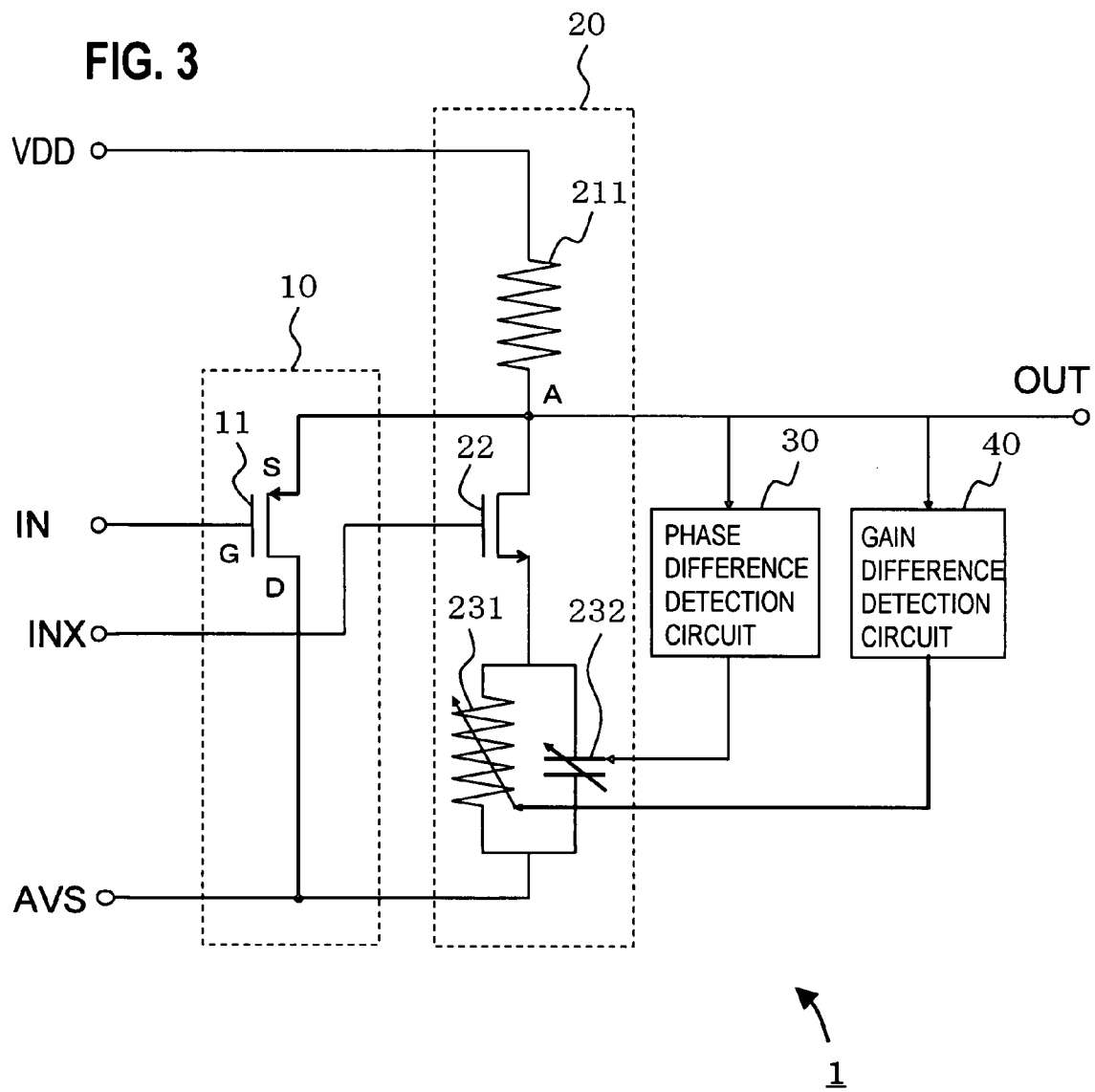
FIG. 3 shows an example of the specific configuration of a conversion circuit for converting a differential signal into a single-phase signal.

Next, the conversion circuit 1 shown in FIG. 3 is explained. Compared with FIG. 2, the conversion circuit 1 is an example in which the first transistor 11 is configured as a pMOS rather than an nMOS transistor. The source of the first transistor 11 is connected to point A, and the drain is connected to terminal AVS, to the variable resistance 231, and to the variable capacitance 232.

In this conversion circuit 1, the terminal AVS is grounded. Hence there is no need to provide the constant-current source 12 (third transistor 121).

Also, the source of the first transistor 11 is connected to the resistance 211, so that the load on the drain of the second transistor 22 and the load on the source of the first transistor 11 are substantially equal. There is no need to accumulate a fixed quantity of the non-inverted signal IN of the differential signals for output using the capacitor 13, as in the example of FIG. 2, and so there is no need to provide the capacitor 13.

Hence by configuring the first transistor 11 as the pMOS transistor, there is no need to provide the constant-current source 12 or capacitor 13, so that compared with the conversion circuit 1 of FIG. 2, the number of components can be reduced. Otherwise the configuration is similar to that of FIG. 2, so that the conversion circuit 1 of this example also enables reduced chip area and reduced power losses.

Figure 4:
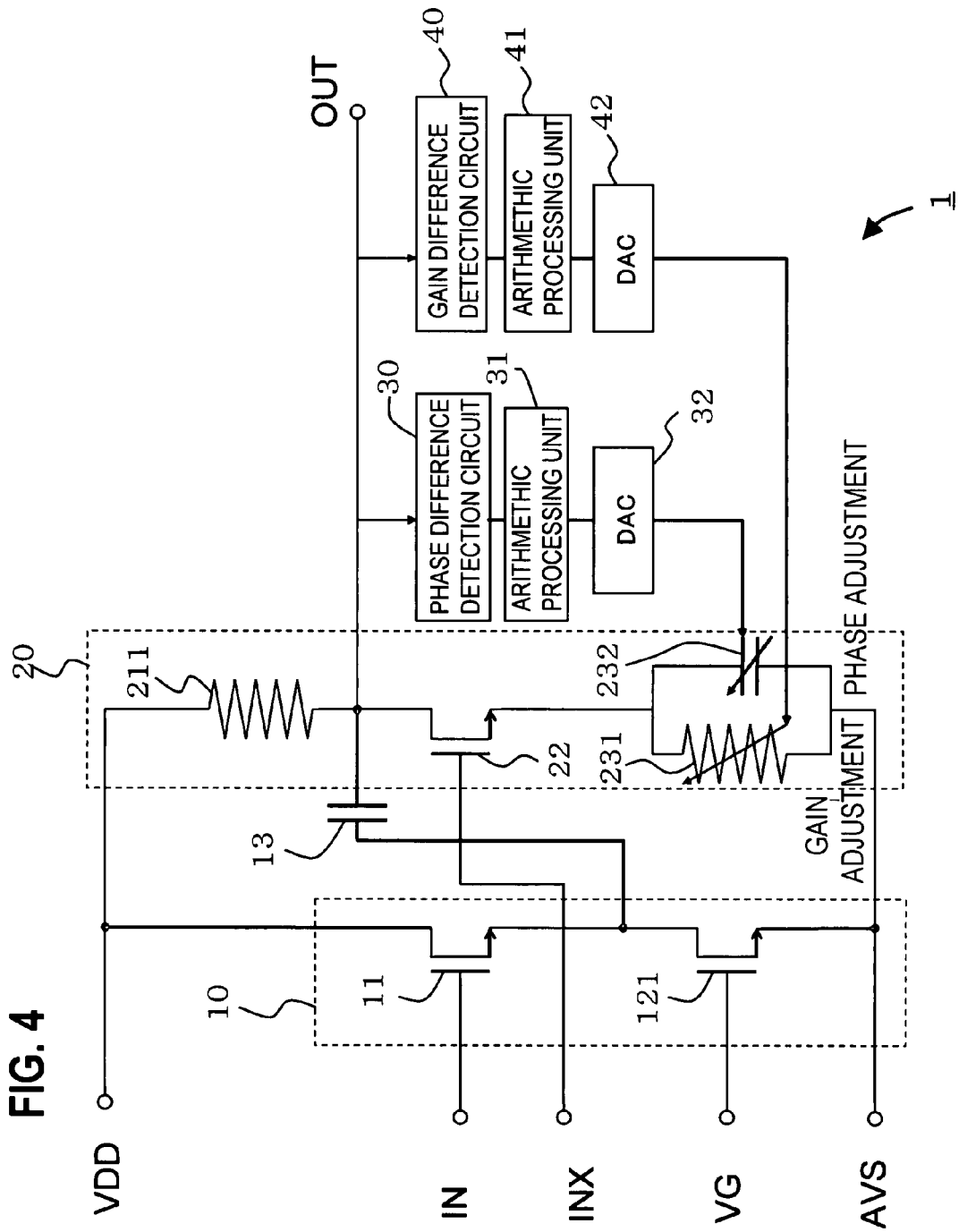
FIG. 4 shows an example of the specific configuration of a conversion circuit for converting a differential signal into a single-phase signal.

FIG. 4 is an example in which the detection results of the phase difference detection circuit 30 and gain difference detection circuit 40 are output as digital signals, and the gain adjuster (variable resistance 231) and phase adjuster (variable capacitance 232) are digitally controlled. Otherwise the configuration is similar to that of FIG. 2.

That is, a first arithmetic processing portion 31 and first DAC (D/A converter) 32 are connected in succession to the output side of the phase difference detection circuit 30, and a second arithmetic processing portion 41 and second DAC 42 are connected to the output side of the gain difference detection circuit 40.

The phase difference detection circuit 30 detects the phase difference similarly to the above examples, and converts the result into the digital signal, which is output. The first arithmetic processing portion 31 has an internal table, for example, and reads and outputs the adjustment amount corresponding to the phase difference from the phase difference detection circuit 30. The capacitance of the variable capacitance 232, which is the phase adjuster 23, is controlled based on the adjustment amount.

When the variable capacitance 232 is analog-controlled, the digital signal from the first arithmetic processing portion 31 is converted to an analog signal by the first DAC 32, to control the capacitance.

The gain difference detection circuit 40, and the second arithmetic processing portion 41 and second DAC 42, operate similarly. When the variable resistance 231 which is the gain adjuster is digitally controlled, control is based on the digital signal according to the adjustment amount from the second arithmetic processing portion 41, and when the variable resistance 231 is analog-controlled, control is performed by conversion to an analog value using the second DAC 42.

Otherwise the configuration is similar to that of FIG. 2; the conversion circuit 1 of this example also enables a reduced chip area and reduced power losses.

Figure 5:
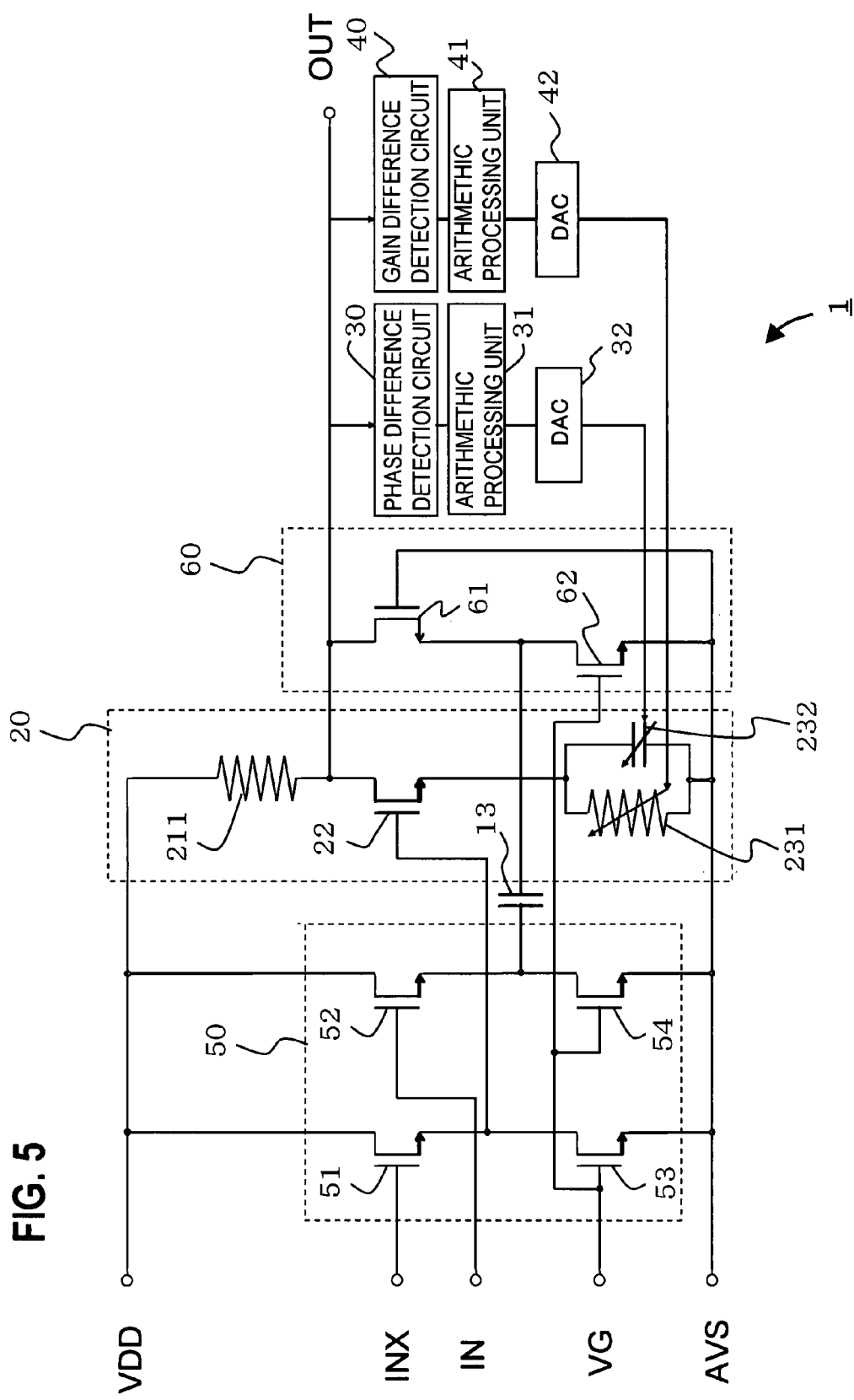
FIG. 5 shows an example of the specific configuration of a conversion circuit for converting a differential signal into a single-phase signal.

Next, the example of FIG. 5 is explained. The conversion circuit 1 of this example is an example in which a buffer 50 is provided in the stage before the source-grounded amplifier 20, and in place of the source-follower amplifier 10 in the following stage, a gate-grounded amplifier 60 is provided.

The buffer 50 has fourth through seventh transistors 51 to 54. The inverted signal INX of the differential signals is input to the gate of the fourth transistor 51, the source is connected to the power supply VDD, and the drain is connected to the source of the sixth transistor 53.

The non-inverted signal IN of the differential signals is input to the gate of the fifth transistor 52, the source is connected to the power supply VDD, and the drain is connected to the source of the seventh transistor 54.

The gate of the sixth transistor 53 is connected to the terminal VG, and the drain is connected to the grounded terminal AVS. The gate of the seventh transistor 54 is also connected to terminal VG, and the drain is connected to terminal AVS.

The drain of the fourth transistor 51 is connected to the gate of the second transistor 22 of the source-grounded amplifier 20, and the drain of the fifth transistor 52 is connected to the capacitor 13.

On the other hand, the gate-grounded amplifier 60 has eighth and ninth transistors 61, 62. The gate of the eighth transistor 61 is grounded (connected to terminal AVS), the single-phase signal OUT is input to the drain, and the source is connected to the source of the ninth transistor 62. The gate of the ninth transistor 62 is connected to the terminal VG, and the drain is grounded.

The buffer 50 buffers the differential signals IN, INX, and is provided to increase the driving power so as to obtain an appropriate output for a large-load circuit (source-grounded amplifier 20 and similar). The non-inverted signal IN of the differential signals is output to the drain of the eighth transistor 61 via the fifth transistor 52 and capacitor 13. A signal in phase with the input non-inverted signal IN is obtained at the source of the eighth transistor 61 (at point B).

On the other hand, the inverted signal INX of the differential signals is input to the gate of the second transistor 22 via the fourth transistor 51. Similarly to the example of FIG. 1 and similar, the phase is inverted at the source of the second transistor 22, and a signal of the same phase as the non-inverted signal IN is output.

The ninth transistor 62 is equivalent to the first transistor 11 of the source-follower amplifier 10 (constant-current source).

At point B, the two in-phase signals (the inverted signal INX and non-inverted signal IN) are added, and the single-phase signal OUT is obtained. Hence similarly to FIG. 1 and similar, the conversion circuit 1 of this example also enables reduced power losses.

Because the phase difference detection circuit 30 and gain difference detection circuit 40 and similar are as in the example of FIG. 4, phase difference and other control is possible by digital control or analog control of the phase difference adjuster (variable capacitor 232) and gain adjuster (variable resistance 231).

Figure 6:
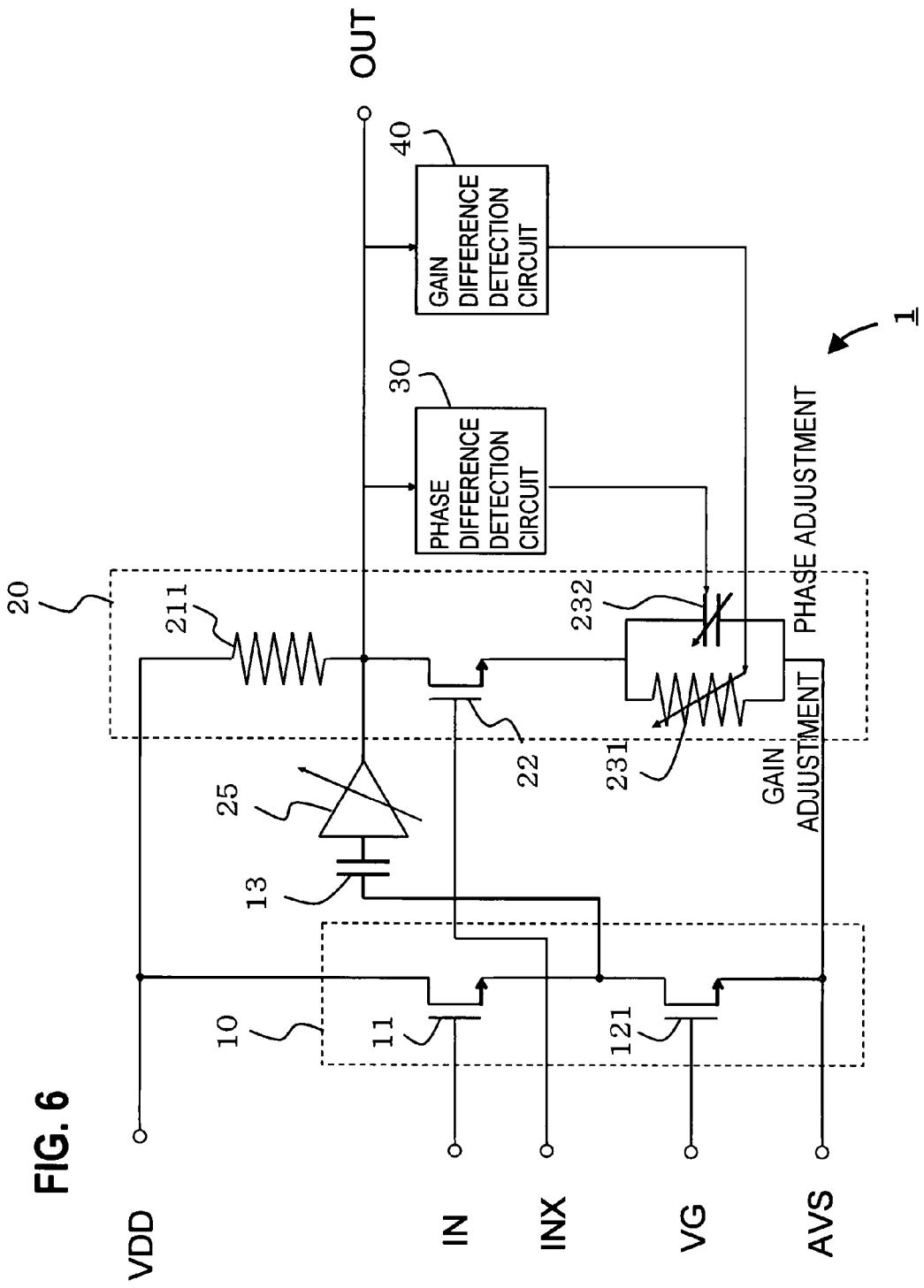
FIG. 6 shows an example of the specific configuration of a conversion circuit for converting a differential signal into a single-phase signal.

FIG. 6 is an example in which a variable amplifier 25 is provided with the source-grounded amplifier 20. When the gain of the inverted signal INX of the differential signals is high, the gain of the non-inverted signal IN of the differential signals is increased by this variable amplifier 25, so that the gains of the two differential signals IN, INX are adjusted to substantially the same level. For this reason, the variable amplifier 25 is provided between the capacitor 13 and point A.

Otherwise the configuration is similar to that of FIG. 2, and the conversion circuit 1 of this example also enabled reduced power losses and a smaller chip area.

Figure 7:
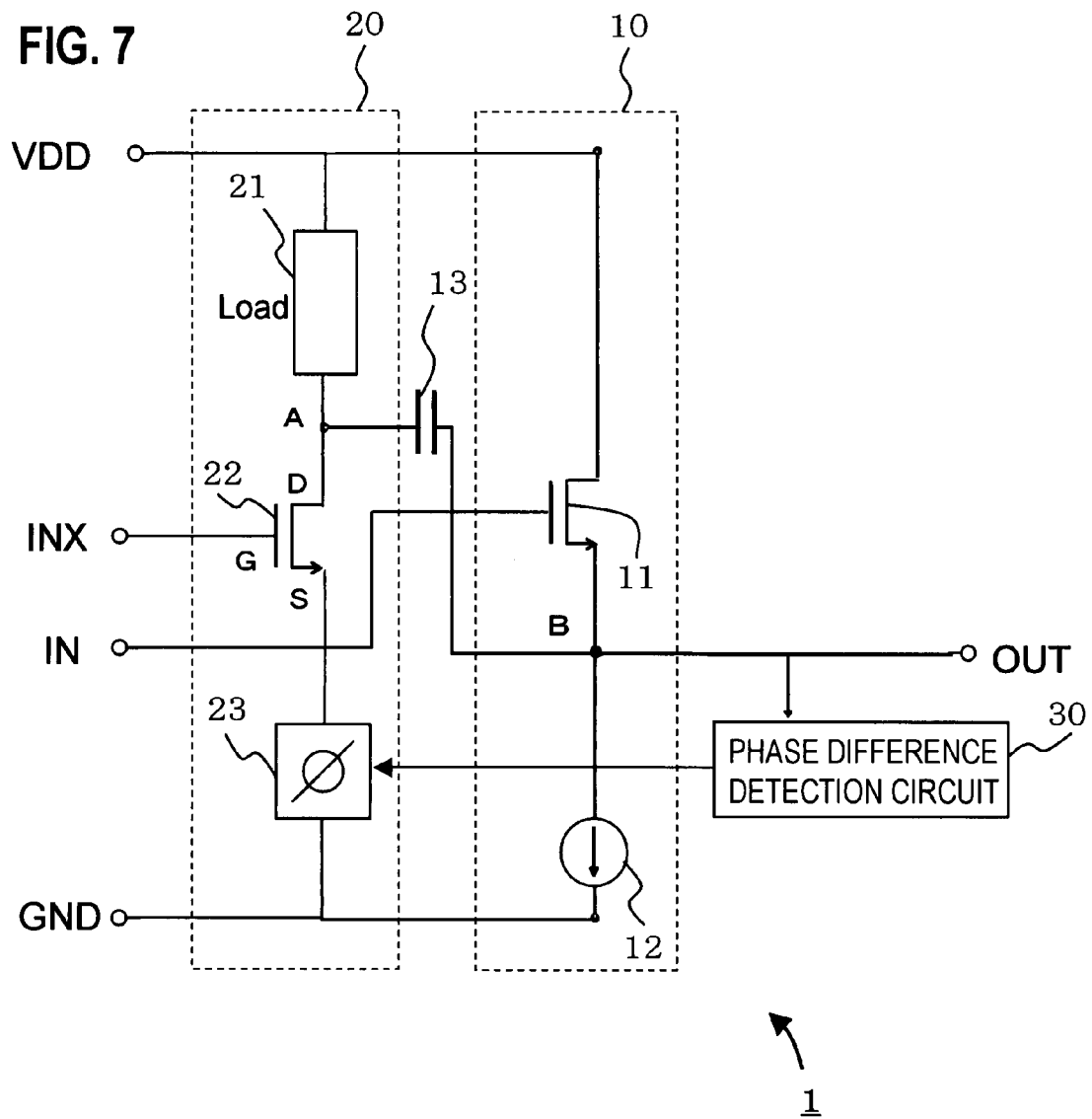
FIG. 7 shows an example of the specific configuration of a conversion circuit for converting a differential signal into a single-phase signal.
Figures 8A, 8B:
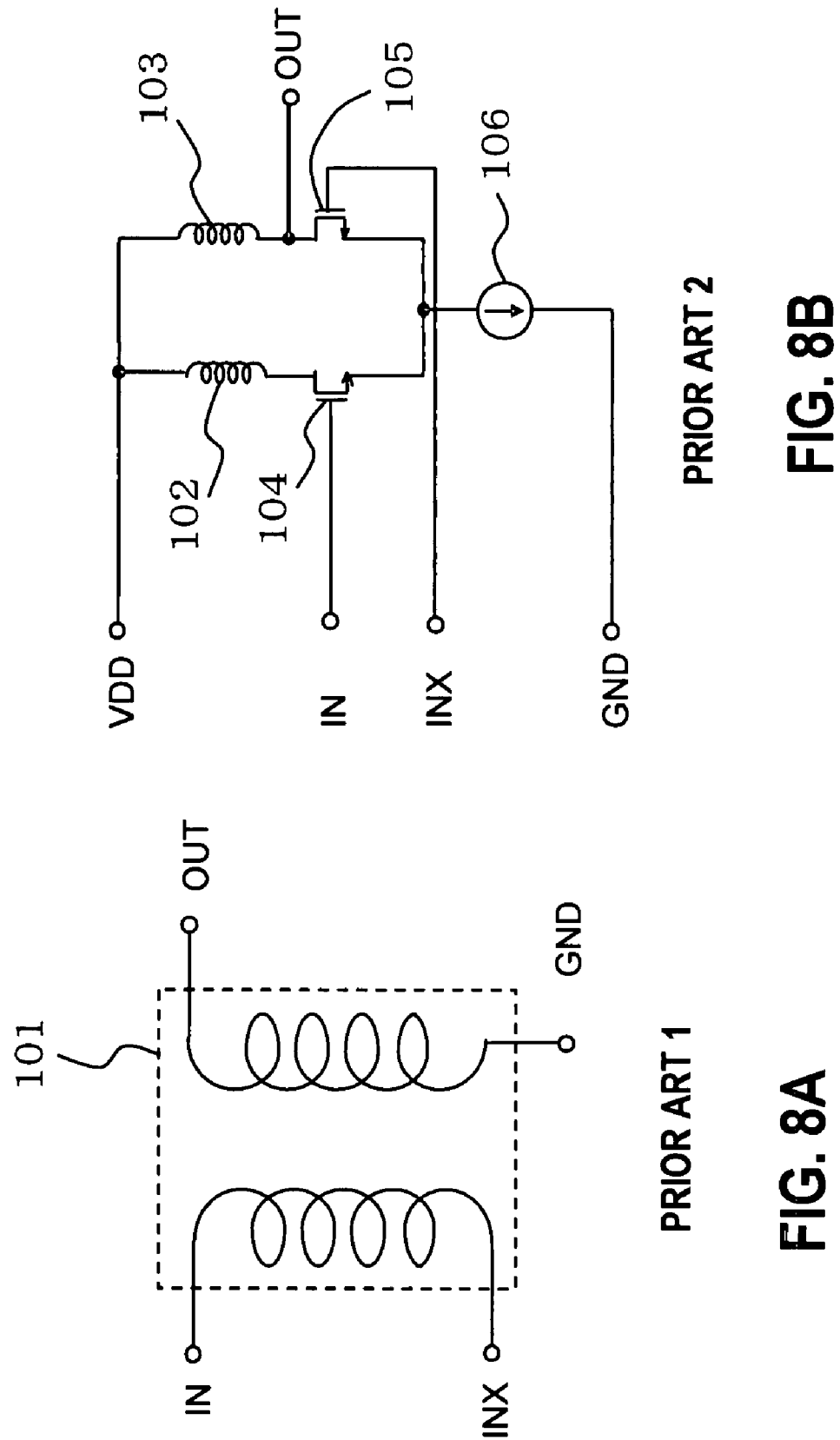
FIGS. 8A and 8B both show examples of the configuration of a conversion circuit for converting a differential signal into a single-phase signal of the prior art.

FIG. 7 is an example of the conversion circuit 1, configured with the source-follower amplifier 10 and source-grounded amplifier 20 in the conversion circuit 1 shown in FIG. 1 interchanged. The configurations of the source-follower amplifier 10 and source-grounded amplifier 20 are similar to those in FIG. 1.

The inverted signal of the inverted signal INX output from the source-grounded circuit 20 (a signal in phase with the non-inverted signal IN) and the non-inverted signal IN from the source-follower amplifier 10 are added at point B, to obtain a single-phase signal OUT.

Hence similarly to the above examples, the conversion circuit is obtained in which power losses are reduced, and the chip area is reduced.

All of the examples described above were explained assuming that the phase of the inverted signal INX of the differential signals is inverted, to make the signal in-phase with the non-inverted signal IN. Of course, if the inverted signal INX is output to the terminal to which the non-inverted signal IN of the differential signals is input, and the non-inverted signal IN is output to the terminal to which the inverted signal INX is input, then the phase of the non-inverted signal IN can be made in-phase with the phase of the inverted signal INX to obtain a single-phase signal OUT. In this case also, similarly to the above-described examples, a conversion circuit can be obtained with reduced chip area and reduced power losses.

The above-described examples were explained assuming that the phase adjuster and gain adjuster are provided at the drain of the second transistor 22. Of course, these may be provided at the gate of the second transistor 22. In this case also, advantageous results similar to those of the above-described examples are obtained.

The above-described conversion circuits 1 are for example suitable for application in portable telephones, wireless LANs, and other communication devices. For example, a configuration can be employed in which the single-phase signal from the conversion circuit 1 is output to an antenna or other communication unit, so that the communication unit performs communication with other communication devices.

What is claimed is:

1. A conversion circuit for converting a differential signal into a single-phase signal, comprising:
   an in-phase output amplifier which amplifies a first differential signal of a pair of differential signals with opposite phases, and outputs a first output signal in-phase;
   an inverted-output amplifier, capacitively coupled with the in-phase output amplifier, which amplifies the second differential signal of the differential signals and inverts the phase of the second differential signal to output a second output signal;
   a circuit which adds the first output signal to the second output signal to output a single-phase signal; and
   a phase adjuster, connected to the drain side or the source side of the source-grounded amplifier, or the output side of the source-follower amplifier, which adjusts the phase difference of the first output signal or the second output signal, or a gain adjuster, connected to the drain side or the source side of the source-grounded amplifier, which adjusts the gain of the first output signal or the second output signal.

2. The conversion circuit according to claim 1, wherein the in-phase output amplifier comprises a source-follower amplifier with the drain grounded, and the inverted-output amplifier comprises a source-grounded amplifier with the source grounded.

3. The conversion circuit according to claim 2, further comprising a gain amplifier which adjusts the gain by amplifying the gain of the first output signal or the second output signal on the output side of the source-follower amplifier.

4. The conversion circuit according to claim 2, further comprising: a detection circuit, connected to the output side of the source-grounded amplifier, which detects the phase difference or gain difference of the first output signal or the second output signal; and
   an arithmetic circuit which performs arithmetic operations on an adjustment amount based on a detection result of the detection circuit,
   wherein the phase adjuster or the gain adjuster performs phase adjustment or gain adjustment based on the adjustment amount.

5. The conversion circuit according to claim 1, wherein the in-phase output amplifier comprises a gate-grounded amplifier with the gate grounded, and the inverted-output amplifier comprises a source-grounded amplifier with the source grounded.

6. The conversion circuit according to claim 5, further comprising a phase adjuster, connected to the drain side or the source side of the source-grounded amplifier, or the output side of the source-follower amplifier, which adjusts the phase difference of the first output signal or the second output signal, or a gain adjuster, connected to the drain side or the source side of the source-grounded amplifier, which adjusts the gain of the first output signal or the second output signal.

7. The conversion circuit according to claim 6, further comprising a gain amplifier which adjusts the gain by amplifying the gain of the first output signal or the second output signal on the output side of the source-follower amplifier.

8. The conversion circuit according to claim 6, further comprising: a detection circuit, connected to the output side of the source-grounded amplifier, which detects the phase difference or gain difference of the first output signal or the second output signal; and
   an arithmetic circuit which performs arithmetic operations on an adjustment amount based on a detection result of the detection circuit,
   wherein the phase adjuster or the gain adjuster performs phase adjustment or gain adjustment based on the adjustment amount.

9. A conversion circuit for converting a differential signal into a single-phase signal, comprising:
   an inverted-output amplifier which amplifies a first differential signal of a pair of differential signals with opposite phases and outputs the inverted signal obtained by inverting the phase of the first differential signal;
   an in-phase output amplifier, capacitively coupled with the inverted-output amplifier, which amplifies the second differential signal of the pair of differential signals, and obtains an in-phase differential signal of the same phase as the second differential signal;
   a circuit which adds the inverted signal to the in-phase differential signal to output a single-phase signal; and
   a phase adjuster, connected to the drain side or the source side of the source-grounded amplifier, or the output side of the source-follower amplifier, which adjusts the phase difference of the first output signal or the second output signal, or a gain adjuster, connected to the drain side or the source side of the source-grounded amplifier, which adjusts the pain of the first output signal or the second output signal.

* * * * *

UNITED STATES PATENT AND TRADEMARK OFFICE
CERTIFICATE OF CORRECTION

PATENT NO. : 7,724,039 B2  
APPLICATION NO. : 11/902301  
DATED : May 25, 2010  
INVENTOR(S) : Tomoyuki Arai Page 1 of 1

It is certified that error appears in the above-identified patent and that said Letters Patent is hereby corrected as shown below:

On the Title page, Item (54), Title, line 1, delete "SIGNAL-PHASE" and insert --SINGLE-PHASE--, therefor.

In column 1, line 1, delete "SIGNAL-PHASE" and insert --SINGLE-PHASE--, therefor.

Signed and Sealed this  
Twenty-second Day of May, 2012

David J. Kappos  
*Director of the United States Patent and Trademark Office*